United States Patent
Tsou et al.

(10) Patent No.: US 10,014,375 B1
(45) Date of Patent: Jul. 3, 2018

(54) III-NITRIDE BASED SEMICONDUCTOR STRUCTURE

(71) Applicant: Industrial Technology Research Institute, Hsinchu (TW)

(72) Inventors: Chuan-Wei Tsou, Hsinchu (TW); Po-Chun Yeh, Taichung (TW); Heng-Yuan Lee, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 0 days.

(21) Appl. No.: 15/722,967

(22) Filed: Oct. 2, 2017

(30) Foreign Application Priority Data

Jul. 26, 2017 (TW) .............................. 106125145 A (51) Int. Cl.
*H01L 29/20* (2006.01)
*H01L 29/10* (2006.01)
*H01L 29/778* (2006.01)

(52) U.S. Cl.
CPC ...... *H01L 29/1095* (2013.01); *H01L 29/2003* (2013.01); *H01L 29/7786* (2013.01)

(58) Field of Classification Search
CPC ............. H01L 29/1095; H01L 29/2003; H01L 29/7786; H01L 29/66; H01L 29/205;
(Continued)

(56) References Cited

U.S. PATENT DOCUMENTS 6,979,844 B2 * 12/2005 Moku .................. H01L 33/007
257/13

7,612,390 B2   11/2009 Saxler et al.
(Continued)

FOREIGN PATENT DOCUMENTS

CN   101714574 A   5/2010
CN   104409496 A   3/2015
(Continued)

OTHER PUBLICATIONS

Uemoto et al, "Gate Injection Transistor (GIT)—A Normally-Off AlGaN/GaN Power Transistor Using Conductivity Modulation," IEEE Transactions on Electron Devices, vol. 54, No. 12, Dec. 2007, 3393-99.
(Continued)

*Primary Examiner* — Chuong A Luu
(74) *Attorney, Agent, or Firm* — Muncy, Geissler, Olds & Lowe, P.C.

(57) ABSTRACT

A III-nitride based semiconductor structure includes a substrate; a buffer layer disposed above the substrate; a first gallium nitrite (GaN) layer disposed above the buffer layer and including p-type GaN; a second GaN layer disposed on the first GaN layer and including at least a first region and a second region; a channel layer disposed above the second GaN layer; a barrier layer disposed above the channel layer; and a gate electrode disposed above the barrier layer. The first region of the second GaN layer is positioned correspondingly to the gate electrode and includes n-type GaN having a first doping concentration. The second region of the second GaN layer (such as the lateral portion of the second GaN layer) is positioned correspondingly to the areas outsides the gate electrode and includes n-type GaN having a second doping concentration larger than the first doping concentration.

18 Claims, 8 Drawing Sheets

(58) Field of Classification Search
CPC ....... H01L 29/20; H01L 29/778; H01L 29/06;
H01L 29/207; H01L 29/7788; H01L
29/0611; H01L 29/401; H01L 29/513;
H01L 29/517; H01L 29/7783; H01L
29/1033; H01L 29/36; H01L 29/12; H01L
29/15; H01L 29/47; H01L 29/201
USPC .......................................................... 257/76
See application file for complete search history.

(56) References Cited

U.S. PATENT DOCUMENTS

| | | | |
|---|---|---|---|
| 7,638,818 | B2 | 12/2009 | Wu et al. |
| 9,391,189 | B2 | 7/2016 | Simin et al. |
| 9,490,357 | B2 | 11/2016 | Khalil et al. |
| 9,536,984 | B2 | 1/2017 | Azize et al. |
| 2011/0272665 | A1* | 11/2011 | Yamaguchi ....... H01L 21/02381 257/12 |
| 2012/0061729 | A1 | 3/2012 | Shibata et al. |
| 2012/0193637 | A1 | 8/2012 | Kalnitsky et al. |
| 2012/0280278 | A1 | 11/2012 | Curatola et al. |
| 2013/0082276 | A1 | 4/2013 | Park et al. |
| 2017/0104094 | A1 | 4/2017 | Then et al. |

FOREIGN PATENT DOCUMENTS

| | | |
|---|---|---|
| TW | 200414313 A | 8/2004 |
| TW | I550855 B | 9/2016 |

OTHER PUBLICATIONS

Cai, et al, "High-Performance Enhancement-Mode AlGaN/GaN HEMTs Using Fluoride-Based Plasma Treatment," IEEE Electron Device Letters, vol. 26, No. 7, Jul. 2005, 435-37

Suh, et al, "p-GaN/AlGaN/GaN Enhancement-Mode HEMTs," Electrical and Computer Engineering and Materials Departments, University of California, Santa Barbara, CA, IEEE Xplore, Feb. 12, 2007, 163-64.
Deguchi, et al, "High On/Off Current Ratio p-InGaN/AlGaN/GaN HEMTs," IEEE Electron Device Letters, vol. 33, No. 9, Sep. 2012, 1249-51.
Liu, et al "Al2O3/AlN/GaN MOS-Channel-HEMTs With an AlN Interfacial Layer," IEEE Electron Device Letters, vol. 35, No. 7, Jul. 2014, 723-25.
Chang, et al "Phenomenon of Drain Current Instability on p-GaN Gate AlGaN/GaN HEMTs," IEEE Transactions on Electron Devices, vol. 62, No. 2, Feb. 2015, 339-345.
Tang, et al, "600-V Normally Off SiNx/AlGaN/GaN MIS-HEMT With Large Gate Swing and Low Current Collapse," IEEE Electron Device Letters, vol. 34, No. 11, Nov. 2013, 1373-75.
Hwang, et al, "p-GaN Gate HEMTs With Tungsten Gate Metal for High Threshold Voltage and Low Gate Current," IEEE Electron Device Letters, vol. 34, No. 2, Feb. 2013, 202-04.
Chu, et al, "1200-V Normally Off GaN-on-Si Field-Effect Transistors With Low Dynamic ON-ResistancE," IEEE Electron Device Letters, vol. 32, No. 5, May 2011, 632-634.
Lu, et al, "Tri-Gate Normally-Off GaN Power MISFET," IEEE Electron Device Letters, vol. 33, No. 3, Mar. 2012, 360-62.
Maroldt, et al, "Gate-Recessed AlGaN/GaN Based Enhancement-Mode High Electron Mobility Transistors for High Frequency Operation,"Japanese Journal of Applied Physics 48, Apr. 20, 2009 04C083, pp. 1-2.
Cai, et al, "Control of Threshold Voltage of AlGaN/GaN HEMTs by Fluoride-Based Plasma Treatment: From Depletion Mode to Enhancement Mode," IEEE Transactions on Electron Devices, vol. 53, No. 9, Sep. 2006, 2207-215.
Saito, et al, "Recessed-Gate Structure Approach Toward Normally Off High-Voltage AlGaN/GaN HEMT for Power Electronics Applications," IEEE Transactions on Electron Devices, vol. 53, No. 2 Feb. 2006, 356-362.

* cited by examiner

III-NITRIDE BASED SEMICONDUCTOR STRUCTURE

This application claims the benefit of Taiwan application Serial No. 106125145, filed Jul. 26, 2017, the disclosure of which is incorporated by reference herein in its entirety.

TECHNICAL FIELD

The disclosure relates in general to a III-nitride based semiconductor structure, and more particularly to a III-nitride based semiconductor structure used in normally-off operation.

BACKGROUND

Along with the advance in technology, the demand for high-energy electronic element is ever increasing. A conventional Si-based and gallium arsenide (GaAs) element has a small energy gap, and therefore fails to comply with the application requirements of high-energy element and must change to a semiconductor material having a wide energy gap such as silicon carbide (SIC) or a III-nitride based nitride such as gallium nitride (GaN). For example, the high electron mobility transistor (HEMT) has higher channel electron mobility and carrier concentration, and better meets the application requirements of high-energy electronics.

The III-nitride based semiconductor structure (such as III-nitride based HEMT) has strong polarization and piezo-electric effects, and will therefore generate two-dimensional electron gas (2DEG) having high density of carriers. The two-dimensional electron gas refers to the electron gas which can move free in two dimensions but is restricted in the third dimension. The two-dimensional electron gas significantly increases the mobility rate of the carriers/electrons of a transistor. However, the two-dimensional electron gas makes the normally-off operation more difficult. According to a conventional method for resolving the above problem, the gate electrode is recessed using a plasma etching process or a p-type GaN layer is added to the underneath of the gate electrode. However, the plasma etching process may easily damage the surface of the structure layer and jeopardize the electronic properties of the element. Moreover, adding a p-type GaN layer to the underneath of the gate electrode will increase the distance between the two-dimensional electron gas and the gate electrode and deteriorate the transconductance (gm) of the elements.

SUMMARY

The disclosure is directed to a III-nitride based semiconductor structure. When the structure disclosed in the embodiments is in a normally-off operation, the part of the structure corresponding to the gate electrode is free of two-dimensional electron gas (2DEG), such that the manufactured structure has excellent electronic properties, and the manufacturing method thereof does not cause any damage to relevant elements or layers of the structure.

According to one embodiment, a III-nitride based semiconductor structure is provided. The III-nitride based semiconductor structure includes: a substrate; a buffer layer disposed above the substrate; a first gallium nitrite (GaN) layer disposed above the buffer layer and including p-type GaN; a second GaN layer disposed on the first GaN layer and including at least a first region and a second region; a channel layer disposed above the second GaN layer; a barrier layer disposed above the channel layer; and a gate electrode disposed above the barrier layer. The first region of the second GaN layer is positioned correspondingly to the gate electrode and includes n-type GaN having a first doping concentration. The second region of the second GaN layer is positioned correspondingly to the areas outsides the gate electrode and includes n-type GaN having a second doping concentration, wherein the first doping concentration is smaller than the second doping concentration.

According to another embodiment, a III-nitride based semiconductor structure is provided. The III-nitride based semiconductor structure includes a substrate; a buffer layer disposed above the substrate; a first gallium nitrite (GaN) layer disposed above the buffer layer and including p-type GaN; a second GaN layer disposed on the first GaN layer and including at least a first region and a second region; a channel layer disposed above the second GaN layer; a barrier layer disposed above the channel layer; and a gate electrode disposed above the barrier layer. The first region of the second GaN layer is positioned correspondingly to the gate electrode and includes p-type GaN. The second region of the second GaN layer is positioned correspondingly to the areas outsides the gate electrode and includes n-type GaN having a heavy doping concentration (such as $>1\times10^{16}$ $1/cm^3$).

The above and other aspects of the disclosure will become better understood with regard to the following detailed description of the preferred but non-limiting embodiment (s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A III-nitride based semiconductor structure is provided in the embodiments of the present disclosure. Based on the embodiments, the semiconductor structure includes a first gallium nitrite (GaN) layer and a second GaN layer which are disposed under a channel layer. The first GaN layer includes p-type GaN. The second GaN layer disposed on the first GaN layer has two different doping concentrations, and includes lightly doped n-type GaN or p-type GaN layer positioned corresponding to the gate electrode (that is, the first region referred in following embodiments). The second GaN layer includes heavily doped n-type GaN positioned corresponding to areas outside the gate electrode (that is, the second region referred in following embodiments). Since two-dimensional electron gas (2DEG) can be eliminated in an area corresponding to the gate electrode, the III-nitride based semiconductor structure of the present disclosure can be used in a normally-off operation. The manufacturing method of the embodiments does not cause any harm to relevant elements or layers of the structure.

The embodiments of the present disclosure have a wide range of application and can be used in high-energy electronic elements under various patterns of normally-off operation. For example, the embodiments of the present disclosure can be used in high-voltage devices or radio frequency (RF) elements, and are not limited to specific modes of application. Relevant embodiments are disclosed below with accompanying drawings for describing the III-nitride based semiconductor structure disclosed in the present disclosure. However, the present disclosure is not limited to the description of the embodiments, and detailed structure, manufacturing process, and material application are for explanatory and exemplary purposes only, not for limiting the scope of protection of the present disclosure.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Moreover, ordinal numbers, such as "the first", "the second", and "the third", are used in the specification and claims to modify the components of the claims. The ordinal numbers of claim components do not imply or represent that the said components have any previous ordinal numbers, nor represent the sequence between a particular claim component and another claim component or the sequence of process in a manufacturing method. The ordinal numbers used to clearly distinguish the claim components having the same designations.

First Embodiment

Figure 1A:
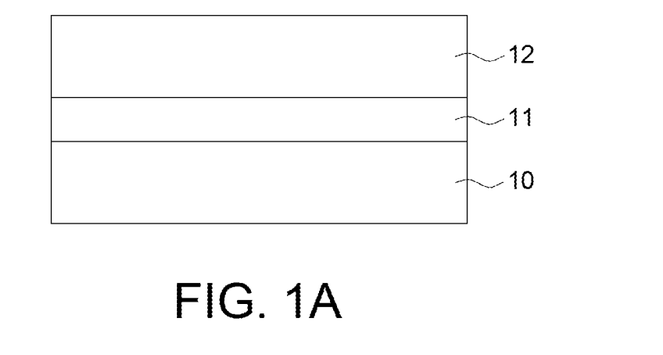
FIG. 1A to FIG. 1E are schematic diagrams of a manufacturing method of a three-dimensional stacking semiconductor structure according to a first embodiment of the disclosure.

FIG. 1A to FIG. 1E are schematic diagrams of a manufacturing method of a three-dimensional stacking semiconductor structure according to a first embodiment of the disclosure. As indicated in FIG. 1A, a substrate 10 is provided, and a buffer layer 12 is formed on the substrate 10. In an embodiment, a nucleation layer 11 is further formed between the substrate 10 and the buffer layer 12. The substrate 10 can be realized by a conductive or semi-insulating substrate, including such as gallium nitride (GaN), silicon (Si) or silicon carbide (SiC), or a sapphire substrate. The nucleation layer 11 may include a semiconductor material such as aluminum nitride (AlN) or aluminum gallium nitride ($Al_xGa_{1-x}N$). The buffer layer 12 can be realized by a graded aluminum gallium nitride ($Al_xGa_{1-x}N$) structure.

Figure 1B:
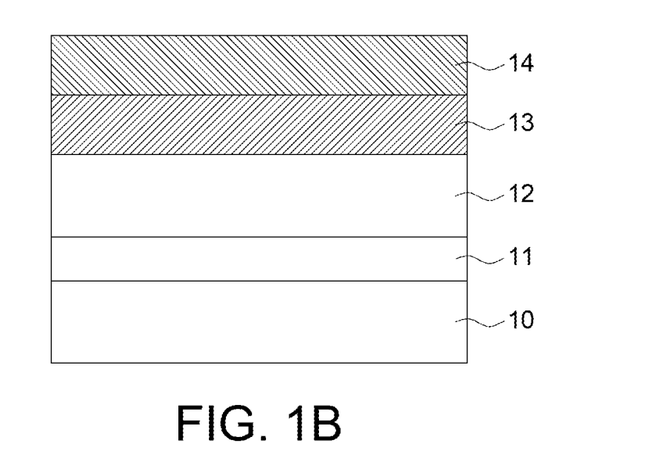

As indicated in FIG. 1B, a first gallium nitrite (GaN) layer 13 and a second GaN layer 14 are sequentially formed above the buffer layer 12. Based on the embodiments, the first GaN layer 13 includes p-type GaN, and the second GaN layer 14 includes n-type GaN, wherein, the second GaN layer 14 can be realized by an unintentionally doped GaN (that is, a naturally formed n-type GaN) layer. In an embodiment, the doping concentration of the n-type GaN of the second GaN layer 14 is, exemplarily but not restrictively, smaller than or equal to the doping concentration of the p-type GaN of the first GaN layer 13.

Figure 1C:
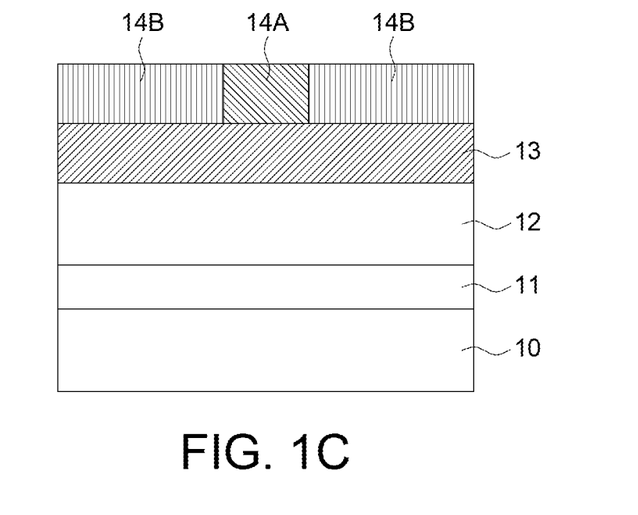

After the second GaN layer 14 is deposited, a partial region of the second GaN layer 14 is heavily doped with n-type GaN having a large doping concentration, and the doped region corresponds to the position in which the gate electrode will be formed afterwards. As indicated in FIG. 1C, after the doping step is completed, the second GaN layer 14 includes a first region 14A, which is positioned corresponding to the gate electrode and includes n-type GaN having a first doping concentration and a second region 14B, which is positioned corresponding to areas outside the gate electrode and includes $n^+$-type GaN having a second doping concentration, wherein the first doping concentration is smaller than the second doping concentration. During the manufacturing process, it is permitted that only the second region 14B is heavily doped to form $n^+$-type GaN, and the first region 14A maintains the original n-type GaN. In an embodiment, the first doping concentration of the n-type GaN of the first region 14A is smaller than or equal to $1\times10^{16}$ $1/cm^3$, and the second doping concentration of the $n^+$-type GaN of the second region 14B is larger than $1\times10^{16}$ $1/cm^3$ but smaller than $1\times10^{21}$ $1/cm^3$ or smaller than $1\times10^{20}$ $1/cm^3$.

Figure 1D:
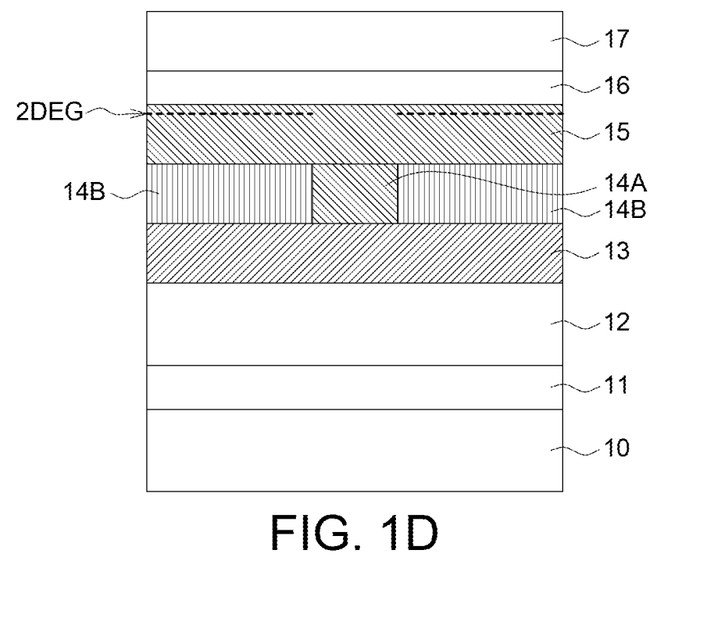

As indicated in FIG. 1D, a channel layer 15, a spacer layer 16 and a barrier layer 17 are sequentially formed above the second GaN layer 14. The formation method includes metal-organic chemical vapor deposition (MOCVD), molecular beam epitaxy (MBE), hydride vapor phase epitaxy (HVPE), liquid phase epitoxy (LPE) and other suitable chemical vapor deposition methods. The spacer layer 16 can be selectively disposed. an embodiment, the channel layer 15 can be realized by an unintentionally doped III-nitride layer formed of gallium nitride (GaN) or gallium nitride indium nitride, wherein the doping concentration of $In_xGa_{1-x}N$, x is larger than 0 but smaller than or equal to 1). The spacer layer 16 can be formed of aluminum nitride (AlN) or aluminum gallium nitride. The barrier layer 17 can be formed of aluminum gallium nitride ($Al_xGa_{1-x}N$,) or gallium nitride indium nitride ($In_yGa_{1-y}N$,) or realized by a stacked layer including one or two nitrides thereof, wherein x is larger than 0 but smaller than or equal to 1, and y is larger than 0 but smaller than or equal to 1. In other embodiments, the three-dimensional stacking semiconductor structure further includes a cap layer disposed above the barrier layer 17. The cap layer can be formed of GaN. The materials of the channel layer 15, the spacer layer 16, the barrier layer 17, and the cap layer are for exemplary purpose only and can be suitably selected to fit actual needs, and the present disclosure is not limited thereto.

Figure 1E:
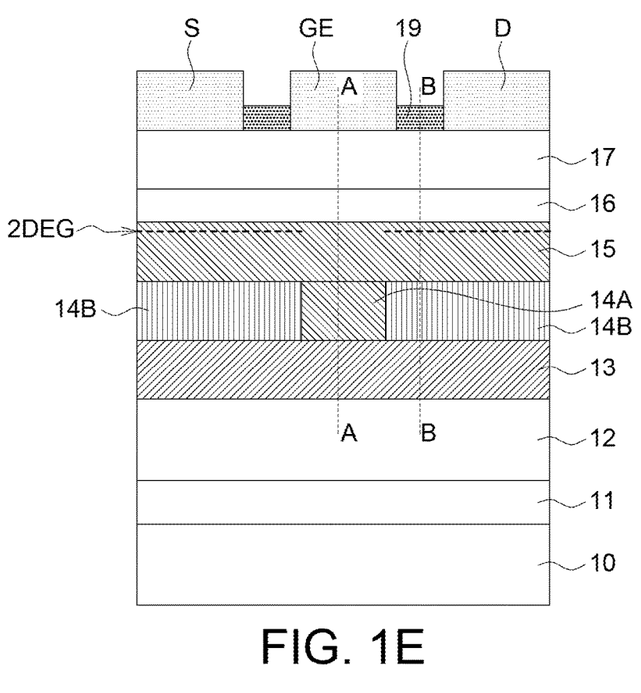

As indicated in FIG. 1E, a gate electrode GE, a source S and a drain D are further formed on the barrier layer 17, wherein the gate electrode GE is disposed between the source S and the drain D, the gate electrode GE is positioned corresponding to the first region of the second GaN layer 14A (having a smaller doping concentration), and the source S and the drain D are positioned corresponding to the second region of the second GaN layer 14B (having a larger doping concentration). The junction between the source S/drain D and the barrier layer 17 forms an Ohm contact, and the junction between the gate electrode GE and the barrier layer 17 forms a Schottky contact. In an embodiment, the source S and the drain D can be realized by a stacked layer formed of titanium/aluminum/titanium nitride, and the gate electrode GE can be realized by a stacked layer formed of nickel/aluminum. Furthermore, a passivation layer 19 is formed between the gate electrode GE and the source S and between the gate electrode GE and the drain D to complete the semiconductor structure of the first embodiment of the disclosure. The passivation layer 19 can be formed of silicon oxide, silicon nitride, and aluminum oxide, aluminum nitride or other suitable materials.

Figure 2A:
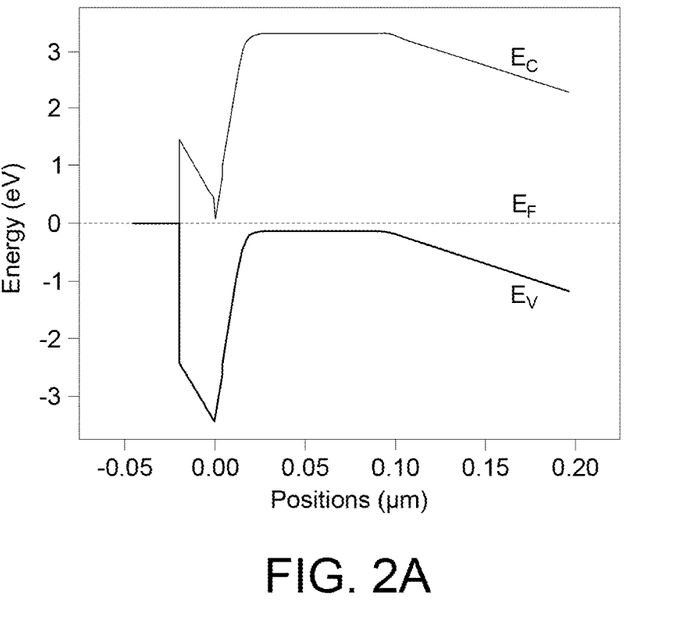
FIG. 2A and FIG. 2B are diagrams of energy belt corresponding to segment A-A and segment B-B of FIG. 1E.
Figure 2B:
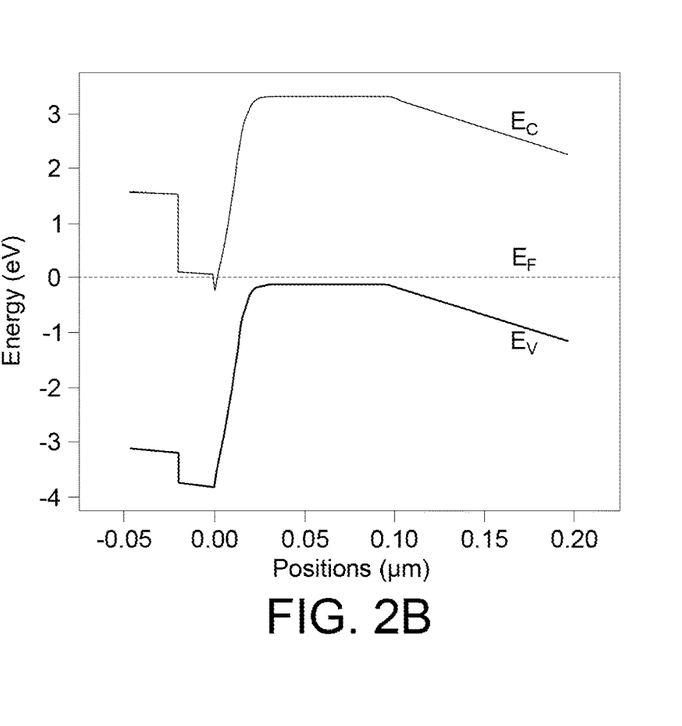

FIG. 2A and FIG. 2B are diagrams of energy belt corresponding to segment A-A and segment B-B of FIG. 1E. Of the semiconductor structure as indicated in FIG. 1E, the segment A-A corresponds to the gate electrode and the first region 14A (such as n-type GaN), and the segment B-B corresponds to areas outside the gate electrode and the second region 14B (such as n$^+$-type GaN). Of the curve as indicated in FIG. 2A, at the part corresponding to the AlGaN/GaN interface (position 0 μm), the conduction band $E_C$ is larger than the forming level $E_F$, and this implies that two-dimensional electron gas (2DEG) already disappears in the segment corresponding to the gate electrode (the dotted lines near the interface between the channel layer 15 and the spacer layer 16 as indicated in FIG. 1E). Of the curve as indicated in FIG. 2B, at position 0 μm, $E_C$ is smaller than $E_F$, and this implies that two-dimensional electron gas can be generated at the segments outside the gate electrode, such as the source/drain segment. Thus, when the present disclosure is used in a semiconductor structure under a normally-off operation, the electron concentration under the gate electrode can be greatly reduced, but the two-dimensional electron gas can be generated at the gate electrode/source segment and the gate electrode/drain segment and form an electron channel. According to the structure and the manufacturing method disclosed in the present disclosure, the semiconductor structure possesses excellent electronic properties, and the corresponding manufacturing method dispenses with conventional plasma etching process, hence avoiding causing damage to relevant elements or layers of the structure.

Second Embodiment

Figure 3:
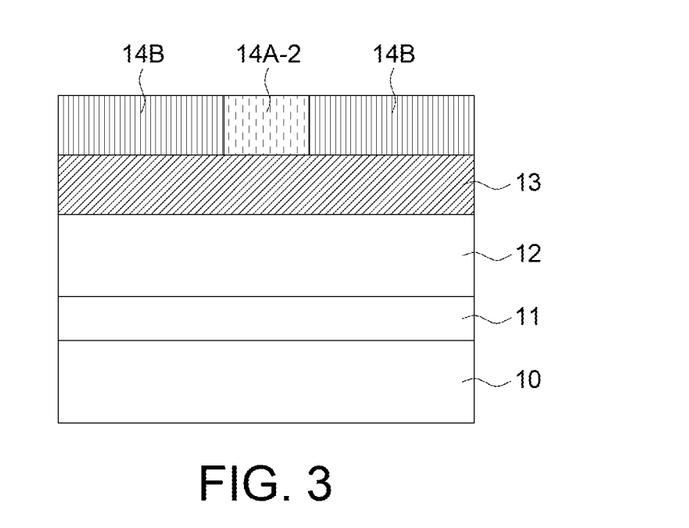
FIG. 3 is a schematic diagram of a three-dimensional stacking semiconductor structure according to a second embodiment of the disclosure.

FIG. 3 is a schematic diagram of a three-dimensional stacking semiconductor structure according to a second embodiment of the disclosure. In following embodiments, designations common to the accompanying drawings and FIG. 1E are used to indicate identical or similar elements. Details of common layers and structures can be obtained with reference to the description of the first embodiment, and the similarities are not repeated here.

In the second embodiment, the first GaN layer 13 also includes p-type GaN, the first region 14A-2 of the second GaN layer is positioned corresponding to the gate electrode disposed on the first GaN layer 13 and includes lightly doped GaN (n$^-$-type GaN) having a small doping concentration, and the second region 14B of the second GaN layer is positioned corresponding to areas outside the gate electrode and includes heavily doped GaN (n$^+$-GaN) having a large doping concentration, wherein the second GaN layer 14 is disposed on the first GaN layer 13. In an embodiment, the doping concentration of the n$^-$-GaN of the first region 14A-2 (that is, the first doping concentration) is smaller than or equal to $1\times10^{15}$ 1/cm$^3$, such as $1\times10^{14}$ 1/cm$^3$, and the doping concentration of the n$^+$-GaN of the second region 14B (that is, the second doping concentration) is larger than $1\times10^{16}$ 1/cm$^3$ but smaller than $1\times10^{21}$ 1/cm$^3$, or is smaller than $1\times10^{20}$ 1/cm$^3$.

Third Embodiment

Figure 4:
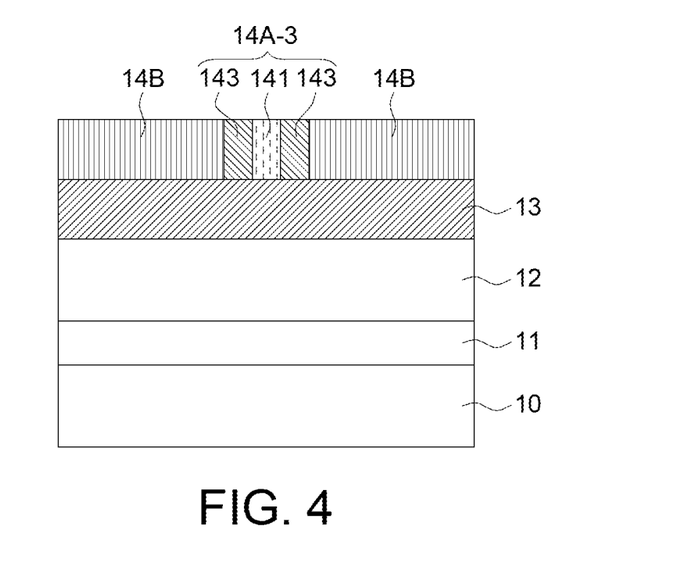
FIG. 4 is a schematic diagram of a three-dimensional stacking semiconductor structure according to a third embodiment of the disclosure.

FIG. 4 is a schematic diagram of a three-dimensional stacking semiconductor structure according to a third embodiment of the disclosure. The third embodiment, the first GaN layer 13 also includes p-type GaN, the second region 14B of the second GaN layer is positioned corresponding to areas outside the gate electrode and includes n$^+$-type GaN having a large doping concentration (that is, the second doping concentration) and the first region 14A-3 is positioned corresponding to the gate electrode and includes GaN having at least two different doping concentrations both smaller than the second doping concentration (the doping concentration of the n$^+$-type GaN), wherein the second GaN layer 14 is disposed on the first GaN layer 13.

As indicated in FIG. 4, the first region 14A-3 has segments 141 and 143, wherein the segment 143 is adjacent to the second region 14B and includes n-type GaN, and the segment 141 is positioned in the middle of the first region 14A-3 but relatively farther away from the second region 14B and includes n$^-$-GaN. In an embodiment, the doping concentration of the segment 141 (n$^-$-type GaN) is equal to or smaller than $1\times10^{15}$ 1/cm$^3$. In another embodiment, the doping concentration of the segment 141 is equal to $1\times10^{14}$ 1/cm$^3$.

Apart from the segments 141 and 143 illustrated in FIG. 4, in practical application, the first region 14A-3 can be doped to have a graded doping concentration. In another embodiment, the first region 14A-3 may have a graded doping concentration smaller than the second doping concentration of the second region 14B, wherein the graded doping concentration decreases towards the center of the first region 14A-3 from edges adjacent to the center of the second region 14B.

Fourth Embodiment

Figure 5:
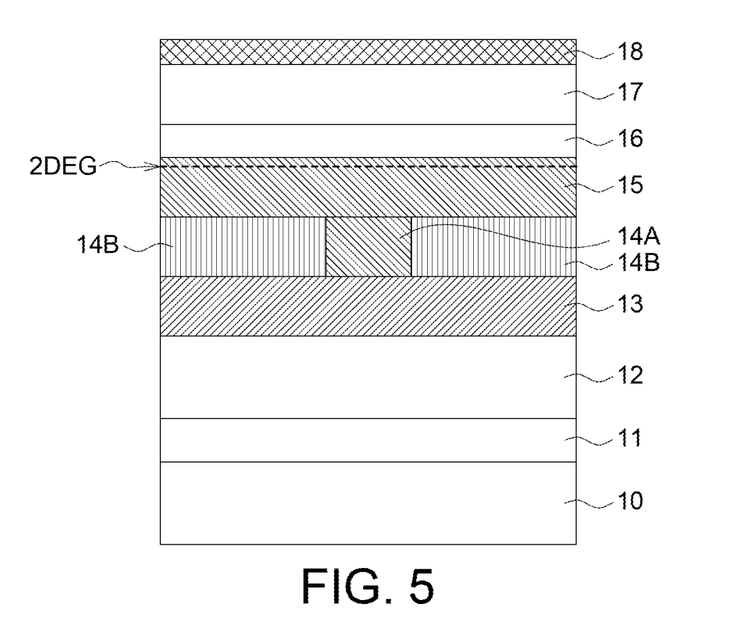
FIG. 5 is a schematic diagram of a three-dimensional stacking semiconductor structure according to a fourth embodiment of the disclosure.

FIG. 5 is a schematic diagram of a three-dimensional stacking semiconductor structure according to a fourth embodiment of the disclosure. In the fourth embodiment, the first GaN layer 13 also includes p-type GaN, and the second GaN layer is disposed on the first GaN layer 13 and also includes a first region 14A and a second region 14B, which wherein the first region 14A is lightly doped and has a small doping concentration and the second region 14B is heavily doped and has a large doping concentration. The present embodiment is different from other embodiments in that the cap layer 18 is formed on the barrier layer 17 and covers the barrier layer 17. Then, the gate electrode GE, the source S, the drain D and the passivation layer 19 as indicated in FIG. 1E are formed on the cap layer 18.

Fifth Embodiment

Figure 6:
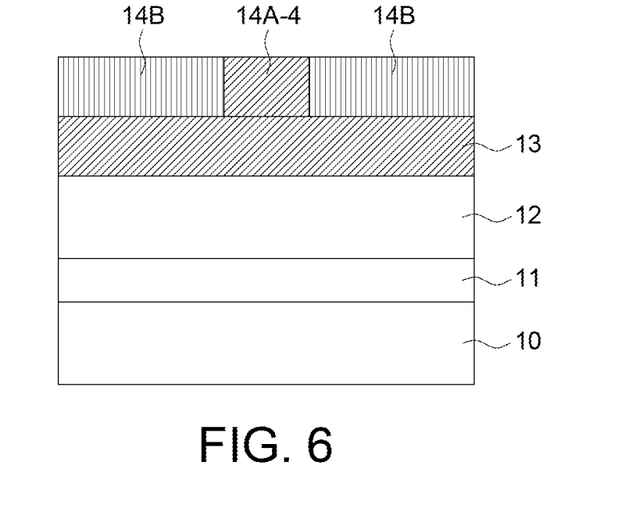
FIG. 6 is a schematic diagram of a three-dimensional stacking semiconductor structure according to a fifth embodiment of the disclosure.

FIG. 6 is a schematic diagram of a three-dimensional stacking semiconductor structure according to a fifth embodiment of the disclosure. The fifth embodiment, the first GaN layer 13 also includes p-type GaN, the second region 14B of the second GaN layer is positioned corresponding to areas outside the gate electrode and includes $n^+$-type GaN having a large doping concentration (that is, the second doping concentration) and the first region 14A-4 of the second GaN layer is positioned corresponding to the gate electrode and includes p-type GaN, wherein the second GaN layer 14 is disposed on the first GaN layer 13. In the above embodiments, the first region includes n-type GaN (n doping concentration and/or $n^-$ doping concentration). The fifth embodiment is different from above embodiments in that the first region 14A-4 includes p-type GaN whose doping concentration is still lower than that of the $n^+$-GaN disposed on both sides of the p-type GaN.

The structure of the fifth embodiment can increase the threshold voltage Vth, that is, the voltage applied to the gate electrode when conducting the channel.

During the manufacturing of the structure of the fifth embodiment, the first GaN layer 13 and the second GaN layer 14 can be manufactured respectively, and the second GaN layer 14 is doped to form the first region 14A-4 and the second region 14B. Or, after the p-type GaN is deposited to a certain thickness, the area corresponding to the second region 14B is doped with $n^+$-type GaN.

Besides, actual sizes of the characteristic length $L_1$ (parallel to a gate length) and the gate length $L_G$ of the first region 14A (14A-2/14A-3/14A-4) of the second GaN layer positioned corresponding to the gate electrode both can be adjusted or modified according to the actual implementations of the elements to meet characteristic requirements of the elements, and the present disclosure does not impose additional restrictions. Two application examples are disclosed below for exemplary and explanatory purposes. However, the present disclosure can also be used in other application examples not exemplified below. In following application example, designations common to the accompanying drawings and FIG. 1E are used to indicate identical or similar elements. Details of common layers and structures can be obtained with reference to the description of the first embodiment, and the similarities are not repeated here.

First Application Example

Figure 7:
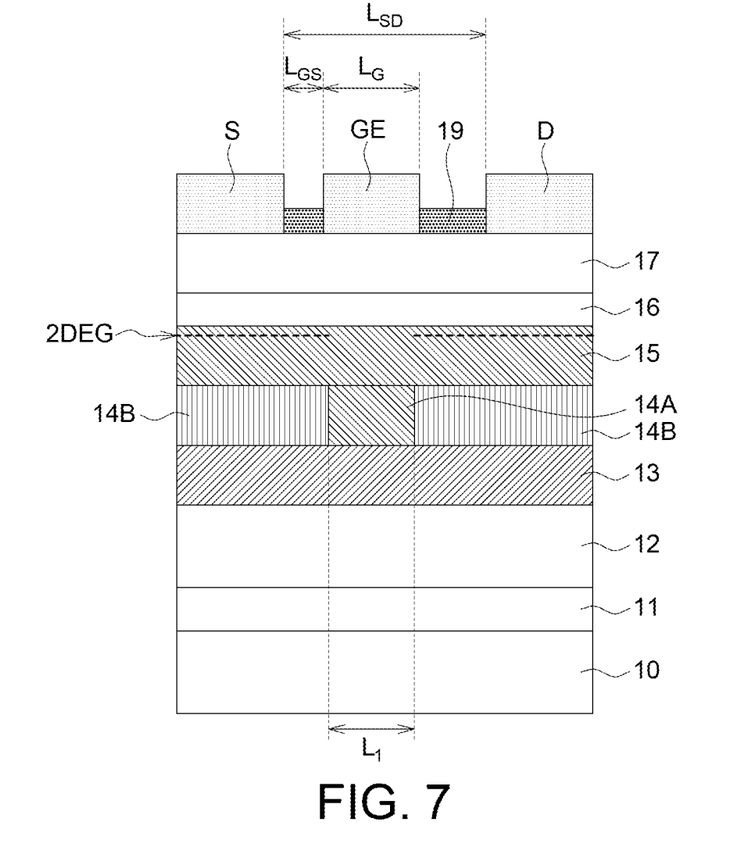
FIG. 7 is a schematic diagram of a three-dimensional stacking semiconductor structure according to a first application example of the disclosure.

FIG. 7 is a schematic diagram of a three-dimensional stacking semiconductor structure according to a first application example of the disclosure.

In the first application example, the semiconductor structure of an embodiment is used as a high-voltage device. As indicated in FIG. 7, the gate electrode GE has a gate length $L_G$, and the first region of the second GaN layer 14A (such as n-type GaN) has a characteristic length $L_1$ parallel to the gate length $L_G$. In an application example, the characteristic length $L_1$ is smaller than or equal to the gate length $L_G$.

In an embodiment, exemplarily but not restrictively, the gate length $L_G$ ranges between 0.5 μm~2 μm, the length $L_{GS}$ from the gate electrode GE to the source S ranges between 1 μm~4 μm, and the length $L_{SD}$ from the source S to the drain D ranges between 5 μm~25 μm.

In an embodiment, the nucleation layer 11 has a thickness ranging between 0.1 μm~0.3 μm; the buffer layer 12 (such as GaN) has a thickness ranging between 1 μm~1.3 μm; the first GaN layer 13 (such as p-type GaN) has a thickness at least larger than 20 nm; the second region of the second GaN layer (such as $n^+$-GaN) has a thickness ranging between 1 nm~9 nm; the channel layer 15 (such as —GaN) has a thickness ranging between 1 nm~9 nm; the spacer layer 16 (such as AlN) has a thickness ranging between 0.5 nm~5 nm; the barrier layer 17 (such as AlGaN) has a thickness ranging between 1 nm~50 nm; the passivation layer 19 has a thickness ranging between 10 nm~0.5 μm. However, the above exemplifications are for explanatory purpose only, not for limiting the present disclosure.

Second Application Example

Figure 8:
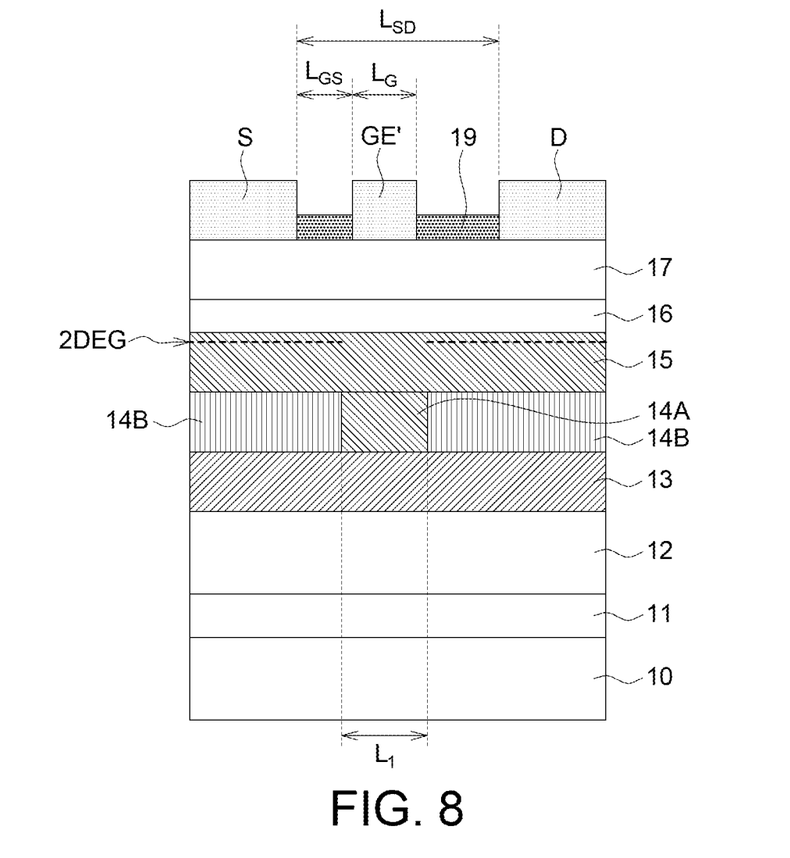
FIG. 8 is a schematic diagram of a three-dimensional stacking semiconductor structure according to a second application example of the disclosure.

FIG. 8 is a schematic diagram of a three-dimensional stacking semiconductor structure according to a second application example of the disclosure.

In the second application example, the semiconductor structure of an embodiment is sued as a radio frequency (RF) element. As indicated in FIG. 8, the gate electrode GE' has a gate length $L_G$, and the first region of the second GaN layer 14A (such as n-type GaN) has a characteristic length $L_1$ parallel to the gate length $L_G$. In an application example, the characteristic length $L_1$ is equal to or larger than the gate length $L_G$.

In an embodiment, exemplarily but not restrictively, the gate length $L_G$ ranges between 0.05 μm~0.2 μm, the length $L_{Gs}$ from the gate electrode GE' to the source S ranges between 0.4 μm~1 μm, and the length $L_{SD}$ from the source S to the drain D ranges between 1 μm~5 μm.

According to the III-nitride based semiconductor structure disclosed in above embodiment, the first GaN layer includes p-type GaN, and the second GaN layer is disposed on the first GaN layer and includes GaN having two different doping concentrations. Particularly, the doping concentration of the GaN of the first region of the second GaN layer positioned corresponding to the gate electrode (such as the n-type GaN or the $n^-$-type GaN or the p-type GaN) is smaller than the doping concentration of the GaN of the first region of the second GaN layer positioned corresponding to areas outside the gate electrode (such as the $n^+$-type GaN). When the present disclosure is used in a semiconductor structure under a normally-off operation, the part of the structure corresponding to the gate electrode is free of two-dimensional electron gas, and no current leakage will be generated when a voltage of 0V is applied to the gate electrode, but the two-dimensional electron gas at the channel still has high electron mobility. Therefore, the manufactured semiconductor structure possesses excellent electronic properties. Moreover, the semiconductor structure manufactured according to the embodiments of the present disclosure and the manufacturing method thereof dispense with conventional plasma etching process, hence avoiding causing damages to relevant elements or layers of the structure.

The structure and steps disclosed above with accompanying drawings are for describing some embodiments or application examples of the present disclosure, and the present disclosure is not limited to the scope and application of the above structure and steps. In other embodiments with different structural patterns, known components of different elements still can be adopted, and the exemplified structure and steps can be modified according to the needs in actual applications. Therefore, the structure illustrated in the drawings is for exemplification purpose only, not for limiting the scope of protection of the present disclosure. Anyone skilled in the technology field of the disclosure will be able to make suitable modifications or changes based on the relevant structure and steps of the present disclosure to meet the needs in actual applications.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A III-nitride based semiconductor structure, comprising:
    a substrate;
    a buffer layer disposed above the substrate;
    a first gallium nitrite (GaN) layer disposed above the buffer layer and comprising p-type GaN;
    a second GaN layer disposed on the first GaN layer and comprising at least a first region and a second region;
    a channel layer disposed above the second GaN layer;
    a barrier layer disposed above the channel layer; and
    a gate electrode disposed above the barrier layer,
    wherein, the first region of the second GaN layer is positioned correspondingly to the gate electrode and comprises n-type GaN having a first doping concentration, and the second region of the second GaN layer is positioned correspondingly to areas outsides the gate electrode and comprises n-type GaN having a second doping concentration, wherein the first doping concentration is smaller than the second doping concentration.

2. The III-nitride based semiconductor structure according to claim 1, wherein the first doping concentration is smaller than or equal to $1 \times 10^{16}$ 1/cm$^3$, and the second doping concentration is larger than $1 \times 10^{16}$ 1/cm$^3$ but smaller than $1 \times 10^{21}$ 1/cm$^3$.

3. The III-nitride based semiconductor structure according to claim 1, wherein the first doping concentration of the first region of the second GaN layer is smaller than or equal to a p-type doping concentration of the first GaN layer.

4. The III-nitride based semiconductor structure according to claim 1, wherein the first region of the second GaN layer positioned corresponding to the gate electrode has at least two different doping concentrations both smaller than the second doping concentration.

5. The III-nitride based semiconductor structure according to claim 1, wherein the first region of the second GaN layer positioned corresponding to the gate electrode has a graded doping concentration smaller than the second doping concentration, and the graded doping concentration gradually decreases towards a center of the first region from edges adjacent to the second region.

6. The III-nitride based semiconductor structure according to claim 1, wherein the first region of the second GaN layer positioned corresponding to the gate electrode comprises:
    an n-type GaN adjacent to the second region; and
    a lightly doped n-type GaN (n$^-$-GaN) disposed in the first region and relatively farther away from the second region.

7. The III-nitride based semiconductor structure according to claim 1, wherein the gate electrode has a gate length parallel to a characteristic length of the first region of the second GaN layer, and the characteristic length is smaller than or equal to the gate length.

8. The III-nitride based semiconductor structure according to claim 7, wherein the gate length is in a range of 0.5 µm to 2 µm.

9. The III-nitride based semiconductor structure according to claim 1, wherein the gate electrode has a gate length parallel to a characteristic length of the first region of the second GaN layer, and the characteristic length is equal to or larger than the gate length.

10. The III-nitride based semiconductor structure according to claim 9, wherein the gate length is in a range of 0.05 µm to 0.2 µm.

11. The III-nitride based semiconductor structure according to claim 1, wherein the first GaN layer has a thickness at least larger than 20 nm, and the second GaN layer has a thickness in a range of 1 nm to 9 nm.

12. The III-nitride based semiconductor structure according to claim 1, further comprising a source and a drain disposed above the barrier layer, wherein the gate electrode is disposed between the source and the drain, and the source and the drain are positioned correspondingly to the second region of the second GaN layer.

13. The III-nitride based semiconductor structure according to claim 1, further comprising a nucleation layer disposed between the substrate and the buffer layer.

14. The III-nitride based semiconductor structure according to claim 1, further comprising a spacer layer disposed between the channel layer and the barrier layer.

15. The III-nitride based semiconductor structure according to claim 1, further comprising a cap layer disposed above the barrier layer and covering the barrier layer.

16. A III-nitride based semiconductor structure, comprising:
    a substrate;
    a buffer layer disposed above the substrate;
    a first gallium nitrite (GaN) layer disposed above the buffer layer and comprising p-type GaN;
    a second GaN layer disposed on the first GaN layer and comprising at least a first region and a second region;
    a channel layer disposed above the second GaN layer;
    a barrier layer disposed above the channel layer; and
    a gate electrode disposed above the barrier layer,
    wherein, the first region of the second GaN layer is positioned correspondingly to the gate electrode and comprises p-type GaN, and the second region of the second GaN layer is positioned correspondingly to areas outsides the gate electrode and comprises n-type GaN having a heavy doping concentration.

17. The III-nitride based semiconductor structure according to claim 16, wherein a doping concentration of the p-type GaN of the first region of the second GaN layer is equal to a doping concentration of the p-type GaN of in the first GaN layer.

18. The III-nitride based semiconductor structure according to claim 16, wherein the second region of the second GaN layer comprises the n-type GaN having a doping concentration ranging between $10^{16}$ 1/cm$^3$ to $10^{21}$ 1/cm$^3$.

* * * * *